United States Patent [19]
Hatakeyama et al.

[11] Patent Number: 5,508,565
[45] Date of Patent: Apr. 16, 1996

[54] SEMICONDUCTOR DEVICE HAVING A PLURALITY OF CHIPS HAVING IDENTICAL CIRCUIT ARRANGEMENT SEALED IN PACKAGE

[75] Inventors: Atsushi Hatakeyama; Fumio Baba; Junichi Kasai; Mitsutaka Sato, all of Kawasaki, Japan

[73] Assignee: Fujitsu Limited, Kawasaki, Japan

[21] Appl. No.: 355,985

[22] Filed: Dec. 14, 1994

Related U.S. Application Data

[63] Continuation of Ser. No. 993,069, Dec. 18, 1992, abandoned.
[51] Int. Cl.⁶ ..................................... H01L 23/48
[52] U.S. Cl. .................... 257/777; 257/672; 257/680; 257/723; 257/773; 257/787
[58] Field of Search ..................... 257/672, 686, 257/723, 777, 787, 773

[56] References Cited

U.S. PATENT DOCUMENTS

| | | | |
|---|---|---|---|
| 4,956,694 | 9/1990 | Eide | 257/686 |
| 4,982,265 | 1/1991 | Watanabe et al. | 257/777 |
| 5,233,220 | 8/1993 | Lamson et al. | 257/787 |

FOREIGN PATENT DOCUMENTS

| | | |
|---|---|---|
| 0221496 | 5/1987 | European Pat. Off. . |
| 0474224A1 | 3/1992 | European Pat. Off. . |
| 4214102A1 | 12/1992 | Germany . |

OTHER PUBLICATIONS

European Search Report dated Jun. 1, 1993.
WO 91/14282, Sep. 19, 1991, PCT International Publication.

Primary Examiner—Edward Wojciechowicz
Attorney, Agent, or Firm—Armstrong, Westerman, Hattori, McLeland & Naughton

[57] ABSTRACT

A semiconductor device includes a first chip having a circuit arrangement, and a plurality of first terminals formed on a main surface of the first chip and substantially arranged into a line. The semiconductor device also includes a second chip having a circuit arrangement identical to that of the first chip, and a plurality of second terminals formed on a main surface of the second chip and substantially arranged into a line. The first and second chips are arranged in a predetermined direction perpendicular to the main surfaces of the first and second chips. The semiconductor device also includes a plurality of connecting members connected to the first terminals and the second terminals and provided for external connections.

35 Claims, 11 Drawing Sheets

SEMICONDUCTOR DEVICE HAVING A PLURALITY OF CHIPS HAVING IDENTICAL CIRCUIT ARRANGEMENT SEALED IN PACKAGE

This application is a continuation of application Ser. No. 07/933,069 filed Dec. 18, 1992, now abandoned.

BACKGROUND OF THE INVENTION

1. Field of the Invention

The present invention generally relates to semiconductor devices, and more particularly to a semiconductor device having a plurality of chips sealed in a package.

2. Description of the Prior Art

The storage capacity of semiconductor storage devices increases by a factor of four times every three years. The storage capacity obtainable in a generation depends on the level of the lithographic technology achieved in the generation. Recently, it has been required to provide compact, less-expensive, advanced information processing devices. These devices need an increased storage capacity.

In order to increase the storage capacity of the above devices, a semiconductor device has been proposed in which a plurality of chips are sealed in a package (see WO 91/14282). Conventionally, chips of two different types having a mirror symmetry relationship must be provided. Hence, it is not easy to efficiently produce the semiconductor devices having the packaged chips.

Figure 1A:
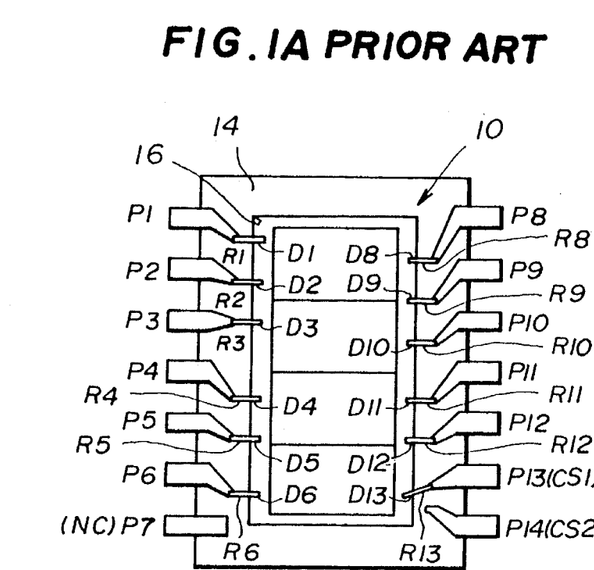
FIG. 1A is a plan view of a type of a chip used in a conventional semiconductor device having a plurality of chips.
Figure 1B:
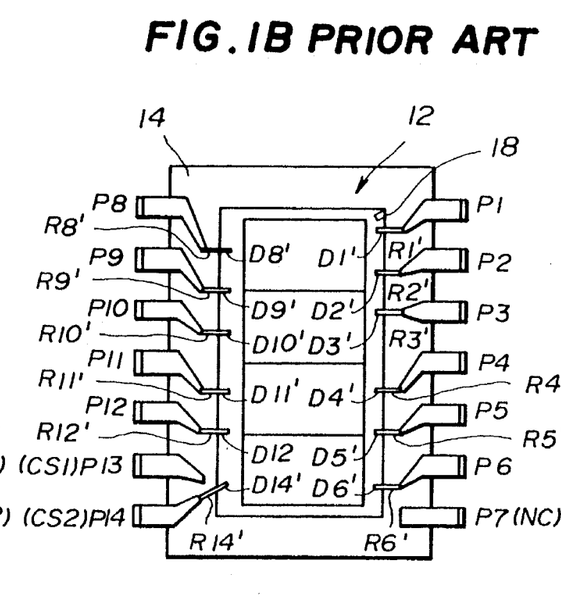
FIG. 1B is a plan view of a chip of a type different from that of the chip shown in FIG. 1B and used in the conventional semiconductor device.
Figure 1C:
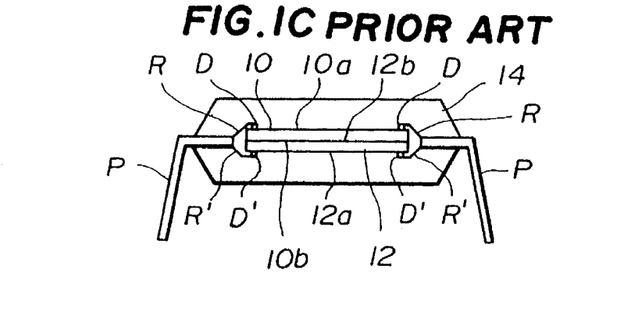
FIG. 1C is a cross-sectional view of the conventional semiconductor device having the chips shown in FIGS. 1A and 1B.

FIGS. 1A, 1B and 1C show a conventional semiconductor device having a plurality of chips. The semiconductor device shown in FIGS. 1A, 1B and 1C includes two chips 10 and 12. The chip 10 has a main surface 10a on which circuit elements are arranged, and a back surface 10b. Similarly, the chip 12 has a main surface 12a on which circuit elements are arranged, and a back surface 12b. The chips 10 and 12 are joined together so that the back surfaces 10b and 12b are in contact with each other, and are sealed in a single package 14. The chips 10 and 12 have circuit arrangements having the mirror symmetry relationship. A mark 16 indicates one of two types of circuit arrangements, and a mark 18 indicates the other circuit arrangement type.

Bumps or pads D1–D6 and D8–D12 are provided on the chip 10, and are connected to pins P1–P6 and P8–P12 by leads (bonding, for example) R1–R6 and R8–R12, respectively. Bumps or pads D1'–D6' and D8'–D12' are provided on the chip 12, and are connected to pins P1'–P6' and P8'–P12' by leads (bonding, for example) R1'–R6' and R8'–R12', respectively. Pin P7 are non-connecting pins which are not connected to the chips 10 and 12. Pins P13 and P14 are chip select pins connected to a bump or a pad D13 of the chip 10 and a bump D14' of the chip 12 by leads R13 and R14', respectively.

The pins P1–P6 and P8–P12 other than the pins P13 and P14 are respectively connected to the bumps D1–D6 and D8–D12 formed on the chip 10 and are further connected to the bumps D1'–D6' and D8'– D12', respectively. The semiconductor device shown in FIGS. 1A–1C has a storage capacity approximately equal to twice the storage capacity of the conventional semiconductor device having a package size equal to that of the conventional semiconductor device.

The semiconductor device shown in FIGS. 1A–1C uses the two different types of chips. That is, the two different circuit arrangements having the mirror symmetry relationship are used. Hence, two different mask patterns must be prepared though the sequences of the production steps for the chips 10 and 12 of the different types are the same as each other. It follows that the semiconductor device cannot be efficiently produced and that a very complex production line is needed. Further, it is troublesome to manage stock in the two different types of chips.

SUMMARY OF THE INVENTION

It is a general object of the present invention to provide a semiconductor device having a plurality of chips in which the above disadvantages are eliminated.

A more specific object of the present invention is to provide a semiconductor device having a plurality of chips which have identical circuit arrangements and which are sealed in a package.

The above objects of the present invention are achieved by a semiconductor device comprising: a first chip having a circuit arrangement, and a plurality of first terminals formed on a main surface of the first chip and substantially arranged into a line; a second chip having a circuit arrangement identical to that of the first chip, and a plurality of second terminals formed on a main surface of the second chip and substantially arranged into a line, the first and second chips being arranged in a predetermined direction perpendicular to the respective main surfaces of the first and second chips; and a plurality of connecting members connected to the first terminals and the second terminals and provided for external connections.

The above objects of the present invention are also achieved by a semiconductor device comprising: a plurality of chips respectively having main surfaces and an identical circuit arrangement, the chips being arranged in a predetermined direction perpendicular to the main surfaces of the chips, each of the chips having a plurality of terminals formed on the main surface and substantially arranged in a line; and a plurality of connecting members connected to the terminals of the chips and provided for external connections, a first one of the chips having a back surface opposite to the main surface thereof, a second one of the chips having a back surface opposite to the main surface thereof, and the back surface of the first one of the chips being in contact with the back surface of the second one of tile chips.

The above objects of the present invention are also achieved by a semiconductor device comprising: a plurality of chips respectively having main surfaces and an identical circuit arrangement, the chips being arranged in a predetermined direction perpendicular to the main surfaces of the chips, each of the chips having a plurality of terminals formed on the main surface and substantially arranged in a line; and a plurality of connecting members connected to the terminals of the chips to an external device, the chips being grouped into a plurality of groups; each of the groups comprising a first one of the chips having a back surface opposite to the main surface thereof, and a second one of the chips having a back surface opposite to the main surface thereof, and the back surface of the first one of the chips being in contact with the back surface of the second one of the chips.

BRIEF DESCRIPTION OF THE DRAWINGS

Other objects, features and advantages of the present invention will become more apparent from the following detailed description when read in conjunction with the accompanying drawings, in which.

DESCRIPTION OF THE PREFERRED EMBODIMENTS

Figure 2A:
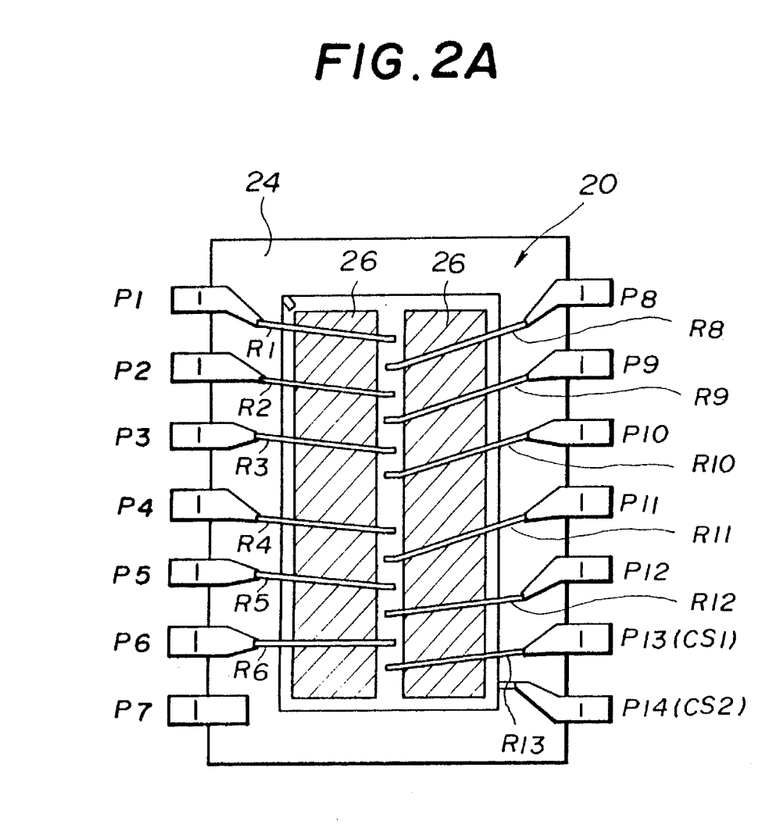
FIG. 2A is a plan view of a first chip used in a semiconductor device according to a first embodiment of the present invention.
Figure 2B:
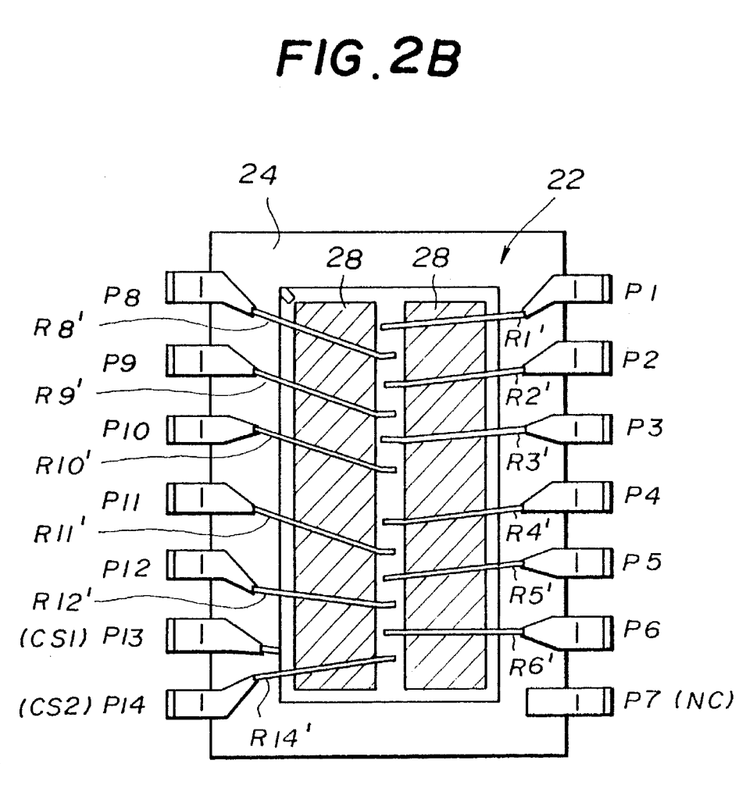
FIG. 2B is a plan view of a second chip used in the first embodiment of the present invention.
Figure 2C:
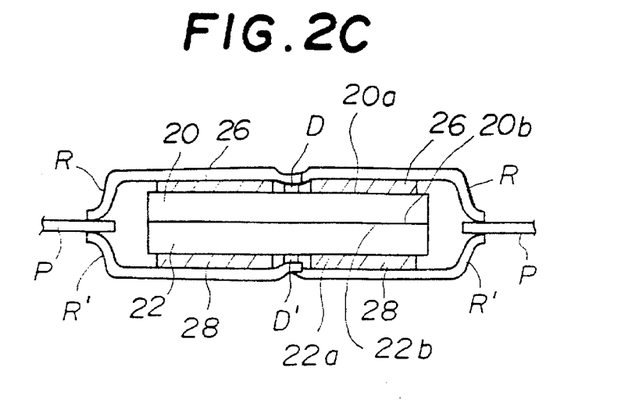
FIG. 2C is a cross-sectional view of the semiconductor device according to the first embodiment of the present invention.
Figure 2D:
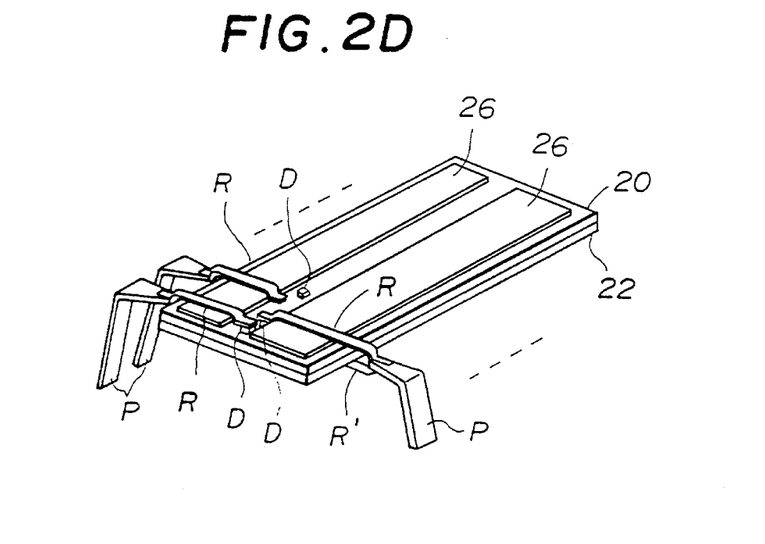
FIG. 2D is a perspective view of the semiconductor device according to the first embodiment of the present invention.

FIGS. 2A, 2B, 2C and 2D are diagrams showing a semiconductor device according to a first embodiment of the present invention. The semiconductor device shown in FIGS. 2A–2D comprises two chips 20 and 22. The chip 20 has a main surface 20a on which circuit elements are arranged, and a back surface 20b. The chip 22 has a main surface 22a on which circuit elements are arranged, and a back surface 22b. As shown in FIG. 2C, the back surfaces 20b and 22b of the chips 20 and 22 are in contact with each other. A circuit arrangement of the chip 20 is the same as that of the chip 22. In other words, the circuit arrangements of the chips 20 and 22 can be formed by identical mask patterns.

As shown in FIG. 2A, insulating films 26 are formed on the main surface 20a of the chip 20 so that a gap defined by the insulating films 26 extends in the longitudinal direction of the chip 20. Similarly, insulating films 28 are formed on the main surface 22a of the chip 22 so that a gap defined by the insulating films 26 extends in the longitudinal direction of the chip 22. As shown in FIG. 2C, the insulating films 26 are in contact with the main surface 20a of the chip 20, and the insulating films 28 are in contact with the main surface 22a of the chip 22.

Figure 3A:
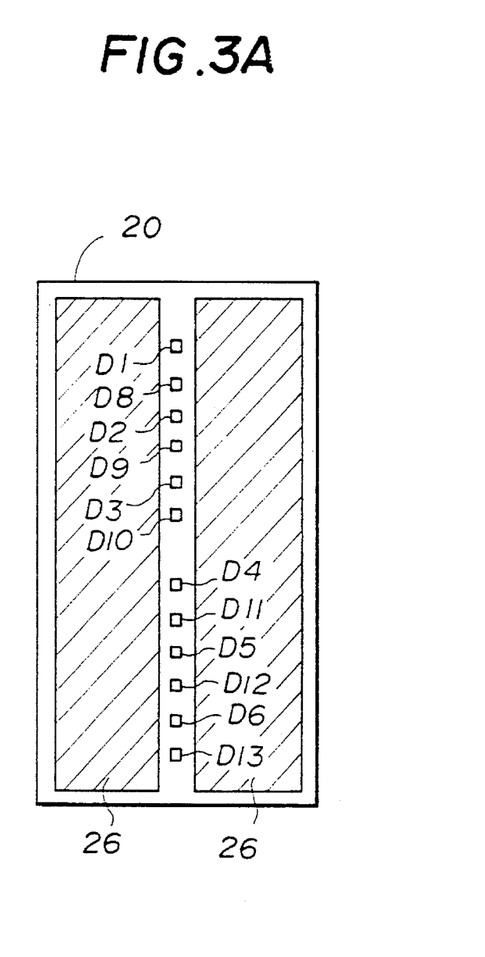
FIG. 3A is a plan view of the first chip used in the first embodiment of the present invention.
Figure 3B:
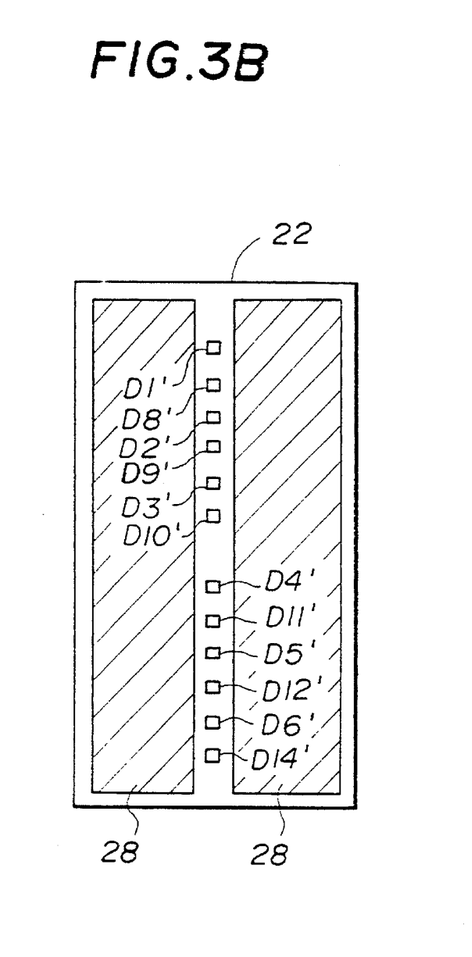
FIG. 3B is a plan view of the second chip used in the first embodiment of the present invention.

As shown in FIG. 3A, the plurality of bumps or pads D1, D8, D2, D9, D3, D10, D4, D11, D5, D12, D6 and D13 are aligned on the chip 20 and located at the center portion of the chip 20 between the insulating films 26. As shown in FIG. 3B, the plurality of bumps or pads D1', D8', D2', D9', D3', D10', D4', D11', D5', D12', D' and D14' are aligned on the chip 22 and located at the center portion of the chip 22 between the insulating films 28.

The bumps D1–D6 and D8–D13 are connected to the pins P1–P6 and P8–P13 by the leads R1–R6 and R8–R13, respectively. These leads are, for example, TAB (Tape Automated Bonding) leads. The bumps D1'–D6', D8'–D12' and D14' are connected to pins the P1∝P6, P8–P12 and P14 by the leads R1'–R6', R8'–R12' and R14', respectively. These leads are, for example, TAB leads. In FIG. 2C, four TAB leads are indicated by R and R', and two bumps are indicated by D and D'. The TAB leads R and R' extend on the insulating films 26 and 28, respectively. The insulating films 26 and 28 function to prevent the TAB leads R and R' from coming into contact with the main surfaces of the chips 20 and 22. The insulating films 26 and 28 made of, for example, polyimide, are formed on the chips 20 and 22. The insulating films 26 and 28 can be TAB tapes having an insulating property. In this case, two-layer tapes consisting of the TAB leads and the TAB tapes are used. Of course, three-layer tapes can also be used.

Pins P7 shown in FIGS. 2A and 2B are non-connecting pins which are not connected to circuits of the chips 20 and 22. The pins P13 and P14 of the chips 20 and 22 are chip select pins. The chip select pin P13 of the chip 20 is connected to the bump D13, while the chip select pin P14 thereof is not connected to any bump. The chip select pin P14 of the chip 22 is connected to the bump D14', and the chip select pin P13 thereof is not connected to any bump. When a chip select signal is externally applied to the pins P13 of the chips 20 and 22, the chip 20 is selected. When a chip select signal is externally applied to the pins P14 of the chips 20 and 22, the chip 22 is selected.

Figure 2E:
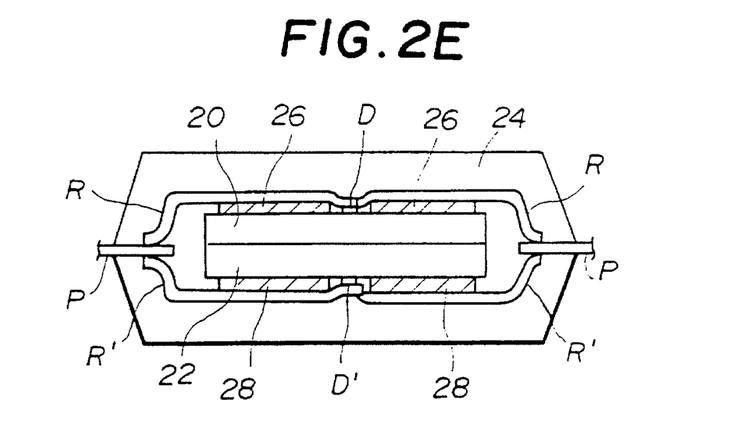
FIG. 2E is a cross sectional view of the semiconductor device in which the chips are sealed in a package of resin.

The semiconductor device according to the first embodiment of the present invention can be produced by the following process. First ends of the TAB leads R and R' are connected to the bumps D and D' formed on the chips 20 and 22, respectively. Next, the TAB leads R and R' are cut. Then, second ends of the TAB leads R of the chip 20 are connected to a lead frame having lead projections by using a bonding tool. In practice, a plurality of chips 20 are fastened to the lead frame at a time. Thereafter, the second ends of the TAB leads R' of the chip 22 are connected to the lead frame so that the back surfaces of the chips 20 and 22 are opposite to each other. In this case, the back surfaces of the chips 20 and 22 may be in contact with each other or slightly spaced apart from each other. In practice, a plurality of chips 22 are fastened to the lead frame at a time. Then, the assembly is sealed in a package 24 of a molded resin, as shown in FIG. 2E.

Figure 4A:
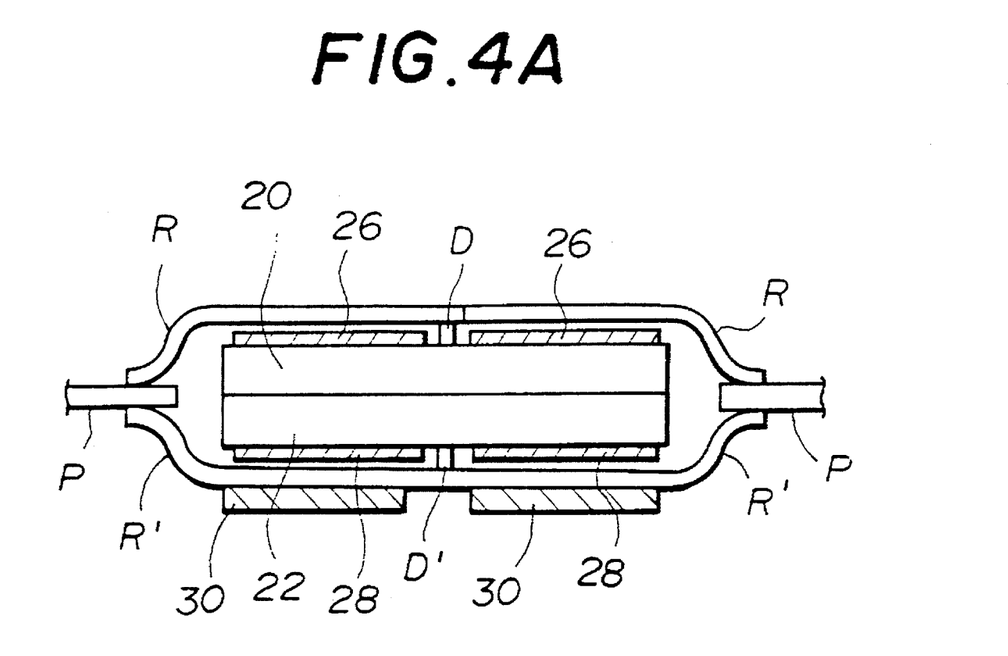
FIG. 4A is a cross-sectional view of a first variation of the first embodiment of the present invention.

FIG. 4A is a cross-sectional view of a first variation of the first embodiment of the present invention. The insulating films 26 made of, for example, polyimide, are spaced apart from the TAB leads R, and the insulating films 28 are spaced apart from the TAB leads R'. The bumps D and D' project above the surface levels of the insulating films 26 and 28, respectively. The end portions of the TAB leads R and R' to be connected to the bumps D and D' extend in a straight manner. Insulating TAB tapes 30 are attached to the TAB leads R'. It is possible to omit the insulating TAB tapes 30.

Figure 4B:
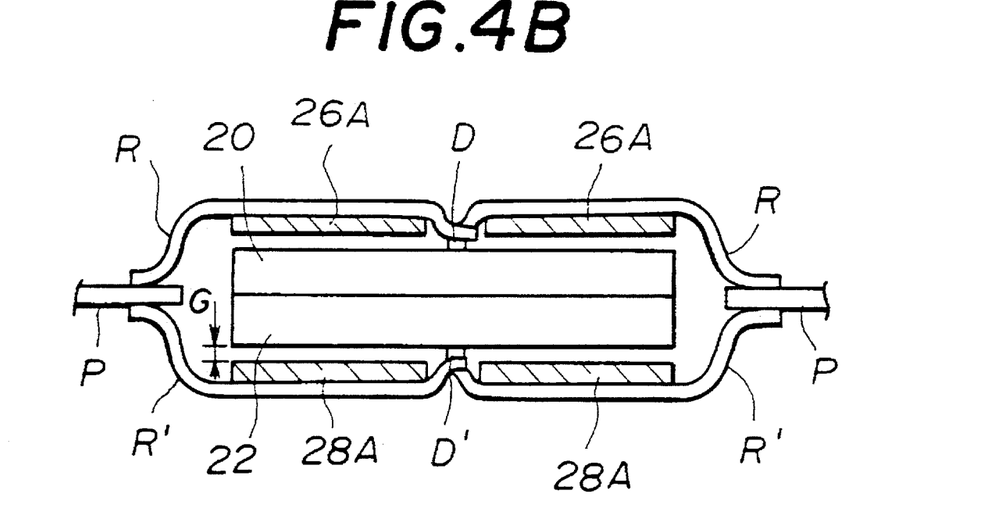
FIG. 4B is a cross-sectional view of a second variation of the first embodiment of the present invention.

FIG. 4B is a cross-sectional view of a second variation of the first embodiment of the present invention. The second variation shown in FIG. 4B employs a multi-layer tape consisting of a TAB lead and an insulating TAB tape. As shown in FIG. 4B, insulating TAB tapes 26A, which are patterned, are connected to the TAB leads R related to the chip 20, and are spaced apart from the chip 20. Alternatively, the insulating TAB tapes 26A may be in contact with the main surface of the chip 20. Similarly, insulating TAB tapes 28A, which are patterned, are connected to the TAB leads R' related to the chip 22, and are spaced apart from the chip 22. Alternatively, the insulating TAB tapes 28A may be in contact with the main surface of the chip 22. A character G indicates a gap between each of the chips 20 and 22 and each of the insulating TAB tapes 26A and 28A. The end portions of the TAB leads R and R' to be connected to the bumps D and D' are curved.

Figure 5A:
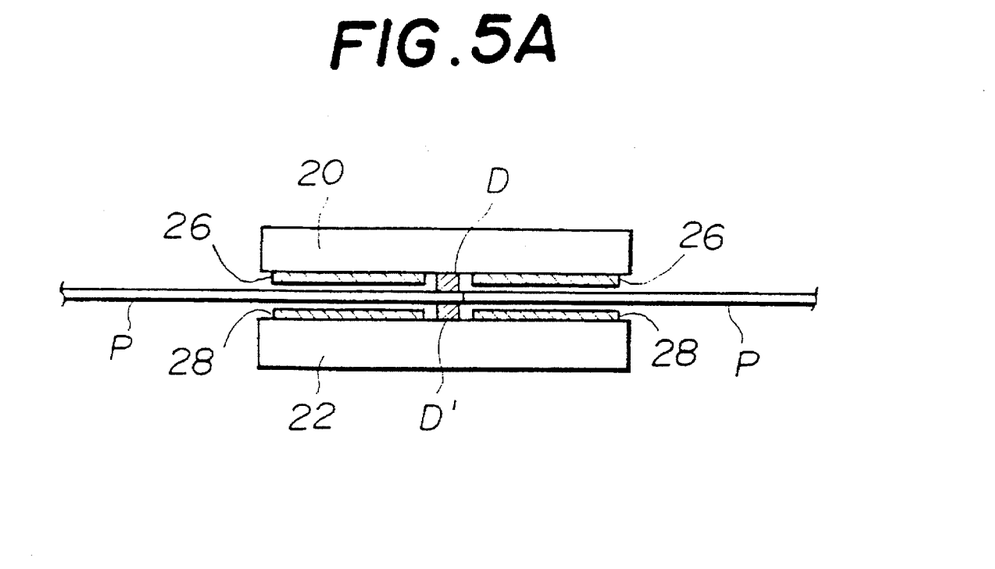
FIG. 5A is a cross-sectional view of a semiconductor device according to a second embodiment of the present invention.
Figure 5B:
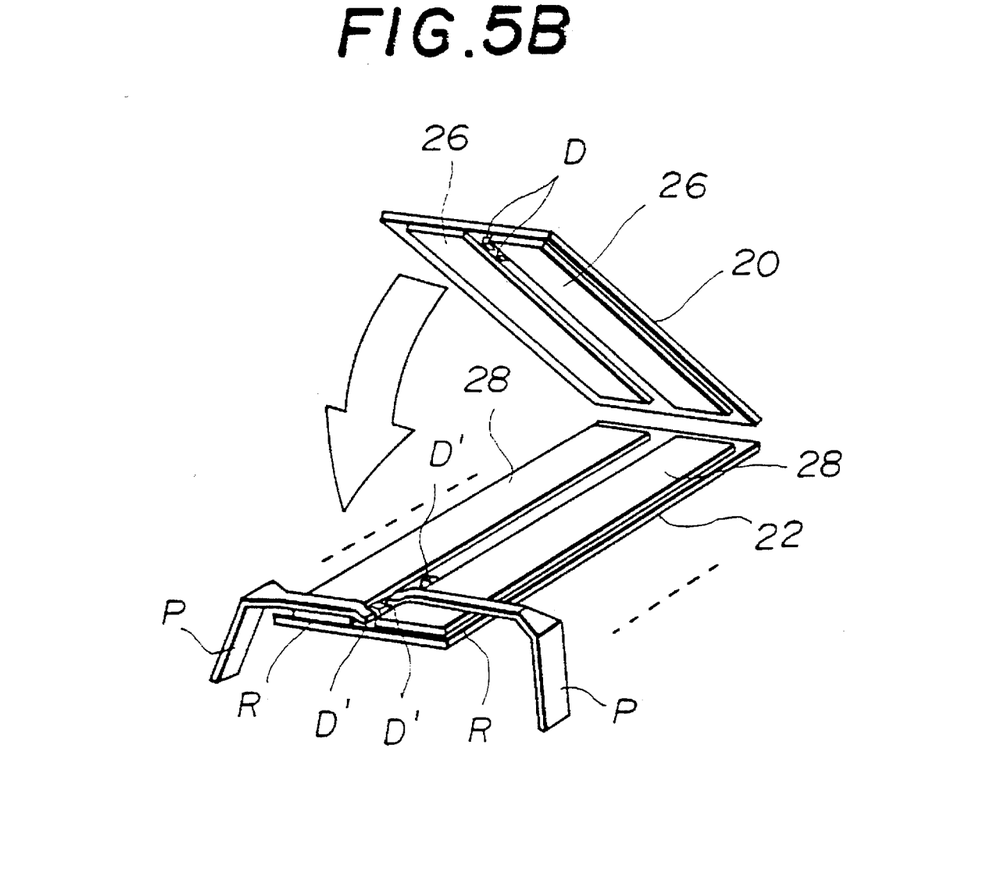
FIG. 5B is a perspective view of the semiconductor device according to the second embodiment of the present invention.

FIGS. 5A and 5B show a semiconductor device according to a second embodiment of the present invention. In FIGS. 5A and 5B, parts that are similar to parts shown in the previous described figures are given the same reference numbers as previously. The main surfaces of the chips 20 and 22 are located so that they are opposite to each other. In this regard, the second embodiment of the present invention differs from the first embodiment thereof. The pins P extend in a straight manner inside a gap between the chips 20 and 22. In other words, the pins P are interposed between the chips 20 and 22. The pins P are connected to the bumps D and D', which project above the surface levels of the insulating films 26 and 28 formed on the chips 20 and 22, respectively. The assembly shown in FIGS. 5A and 5B are sealed in the same manner as shown in FIG. 2E. Hence, the spacings and gaps are filled with resin.

Figure 6:
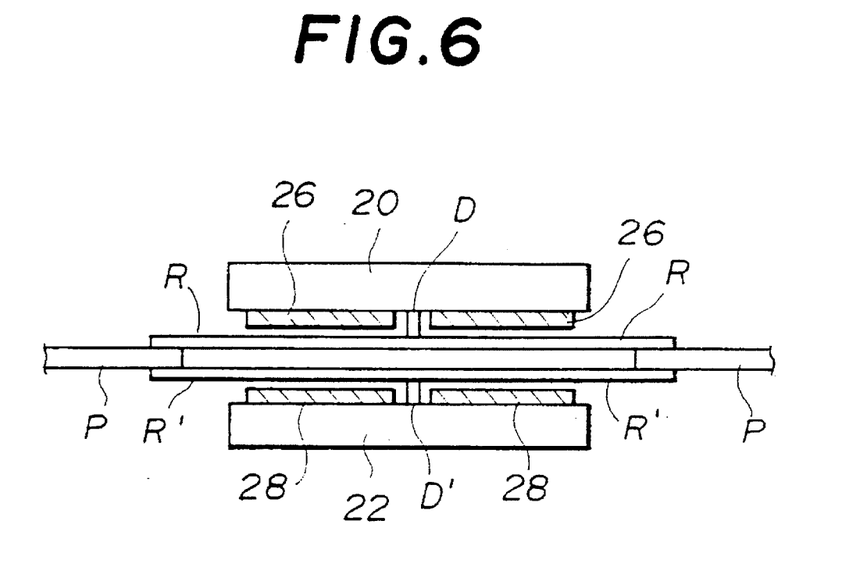
FIG. 6 is a cross-sectional view of a variation of the second embodiment of the present invention.

FIG. 6 shows a variation of the second embodiment of the present invention. In FIG. 6, parts that are similar to parts shown in the previously described figures are given the same reference numbers as previously. The main surfaces of the chips 20 and 22 are opposite to each other. The variation shown in FIG. 6 incldes TAB leads R and R', which have first ends connected to the pins P and second ends connected to the bumps D and D'. The TAB leads R connected to the bumps D of the chip 20 are spaced apart from the TAB leads R' connected to the bumps D' of the chip 22. Further, the TAB leads R connected to the bumps D of the chip 20 are spaced apart from the insulating film 26 formed on the main surface of the chip 20. Similarly, the TAB leads R' connected to the bumps D' of the chip 22 are spaced apart from the insulating film 28 formed on the main surface of the chip 22. The TAB leads R and R' may be in contact with the insulating films 26 and 28. The assembly shown in FIG. 6 is them sealed in mold resin so that only the pins (outer leads) P project from the package. Hence, the spacings and gaps are filled with resin.

Figure 7A:
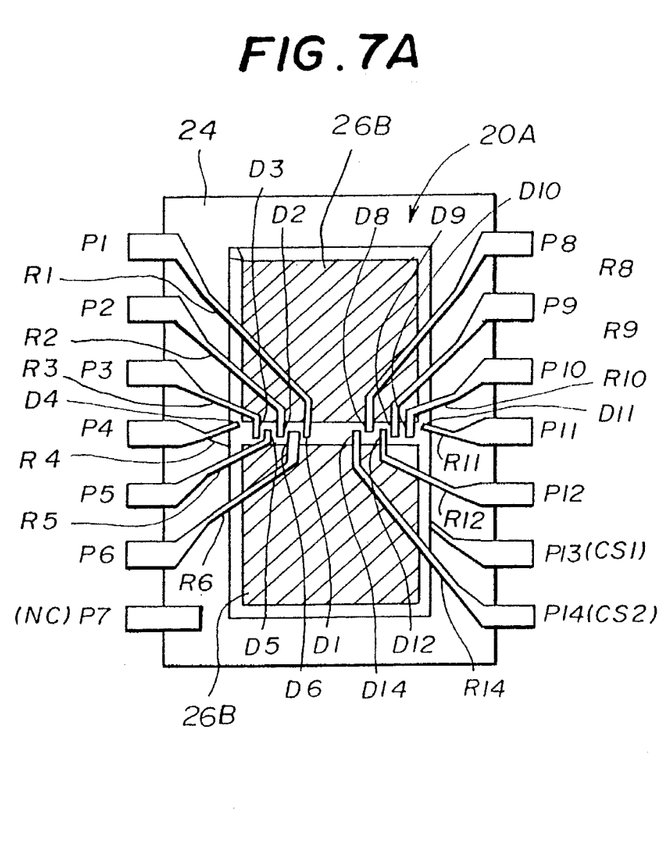
FIG. 7A is a plan view of a first chip used in a semiconductor device according to a third embodiment of the present invention.
Figure 7B:
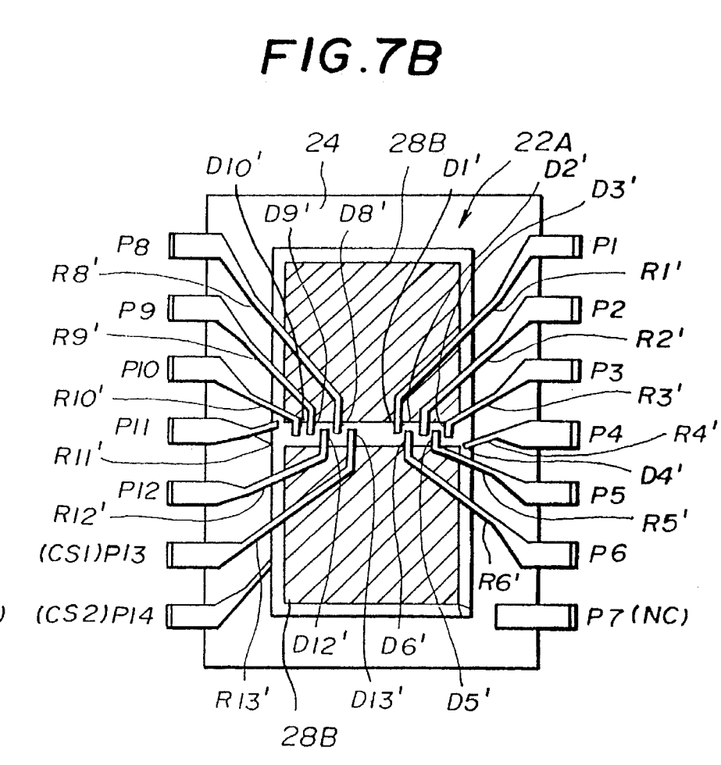
FIG. 7B is a plan view of a second chip used in the semiconductor device according to the third embodiment of the present invention.

A description will now be given of a semiconductor device according to a third embodiment of the present invention with reference to FIGS. 7A and 7B, in which parts that are similar to parts shown in the previously described figures are given the same reference numbers.

The semiconductor device according to the third embodiment of the present invention comprises chips 20A and 22A, which have identical circuit arrangements. A plurality of bumps or pads D formed on the chip 20A are arranged in a line in the direction perpendicular to the longitudinal direction of the chip 20A. In FIG. 7A, bumps D4, D3, D5, D2, D6, D1, D14, D8, D12, D9, D10, and D11 are aligned in this order from the left side of the chip 20A shown in FIG. 7A. Insulating films 26B made of, for example, polyimide, are formed on the main surface of the chip 20A so that the bumps D are interposed between the insulating films 26B. The bumps D are connected to the corresponding pins P by TAB leads R, which extend on or above the insulating films 26B.

A plurality of bumps or pads D' formed on the chip 22A are arranged in a line in the direction perpendicular to the longitudinal direction of the chip 22A. In FIG. 7B, bumps D4', D3', D5', D2', D6', D1', D14', D8', D12', D9', D10', and D11' are aligned in this order from the right side of the chip 22A shown in FIG. 7B. That is, the chip 22A shown in FIG. 7B corresponds to the chip 20A shown in FIG. 7A when the chip 20A is rotated by 180°. Insulating films 28B made of, for example, polyimide, are formed on the main surface of the chip 22A so that the bumps D' are interposed between the insulating films 28B. The bumps D' are connected to the corresponding pins P by TAB leads R', which extend on or above the insulating films 28B.

The chips 20A and 22A can be connected to the pins P so that the back surfaces thereof are opposite to each other. It is also possible to position the chips 20A and 22A so that the main surfaces thereof are opposite to each other.

It will be noted that various variations and modification can be made on the basis of the above-described semiconductor devices, each having two chips.

Figure 8A:
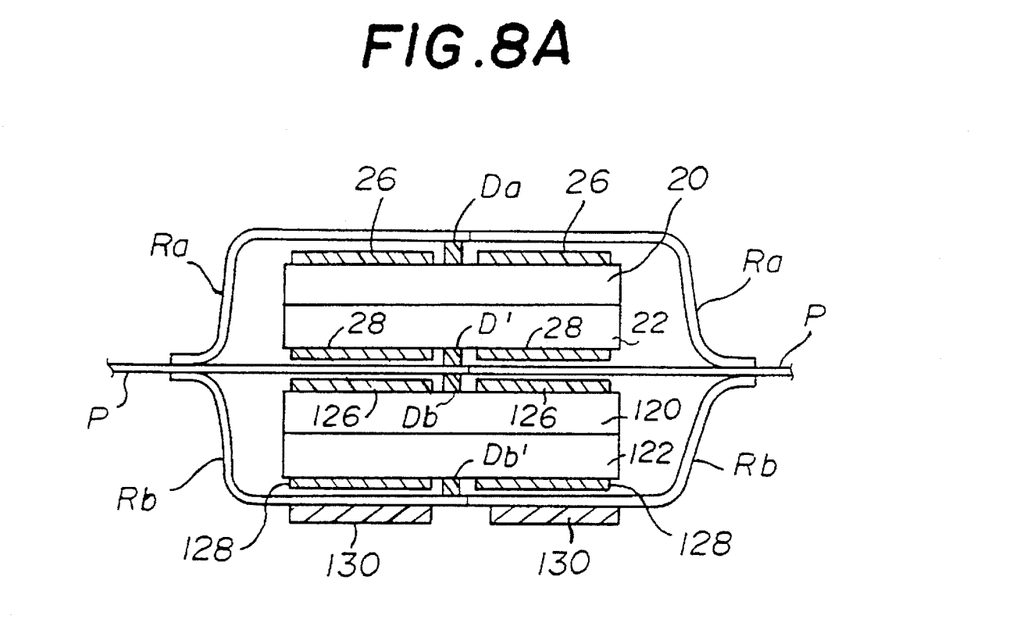
FIG. 8A is a cross-sectional view of a semiconductor device according to a fourth embodiment of the present invention.
Figure 8B:
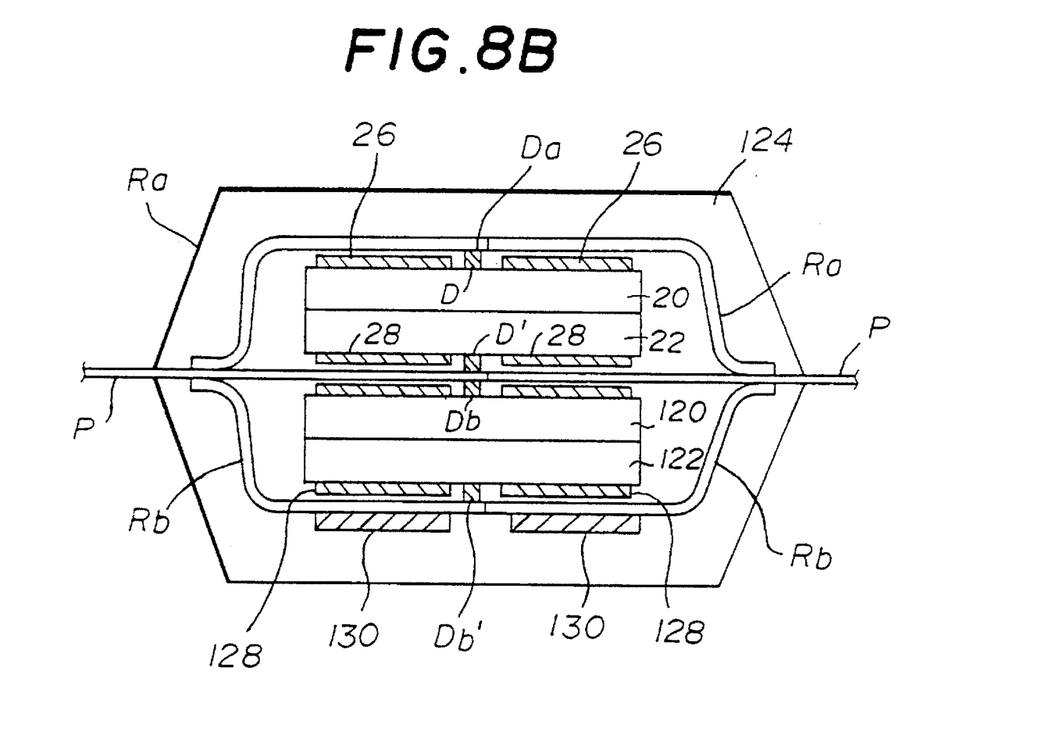
FIG. 8B is a cross-sectional view of the semiconductor device of the fourth embodiment having a molded package.

FIGS. 8A and 8B show a semiconductor device according to a fourth embodiment of the present invention. In FIGS. 8A and 8B, parts that are the same as parts shown in the previously described figures are given the same reference numbers. The semiconductor device shown in FIGS. 8A and 8B is based on the structures shown in FIGS. 4A and 5A. More specifically, the semiconductor device comprises four chips 20, 22, 120 and 122 having identical circuit arrangements. The back surfaces of the chips 20 and 22 are in contact with each other, and the back surfaces of the chips 120 and 122 are in contact with each other. TAB leads Ra have first ends connected to the pins P, and second ends connected to the bumps D formed on the main surface of the chip 20. The pins P extend in the gap between the chips 22 and 120, and are connected to the bumps D' formed on the main surface of the chip 22. The pins P are also connected to bumps Db formed on the main surface of the chip 120.

TAB leads Rb have first ends connected to the pins P, and second ends connected to bumps Db' formed on the main surface of the chip 122. The bumps D, D', Db and Db' are arranged in a line on the main surfaces of the chips 20, 22, 120 and 122, as shown in FIGS. 3A and 3B. TAB tapes 130 connected to the TAB leads Rb can be omitted. The chip size of the semiconductor device shown in FIGS. 8A and 8B is the same as that of the semiconductor device shown in FIG. 4A. However, the storage capacity of the semiconductor device shown in FIGS. 8A and 8B is twice the storage capacity of the semiconductor device shown in FIG. 4A.

Figure 9:
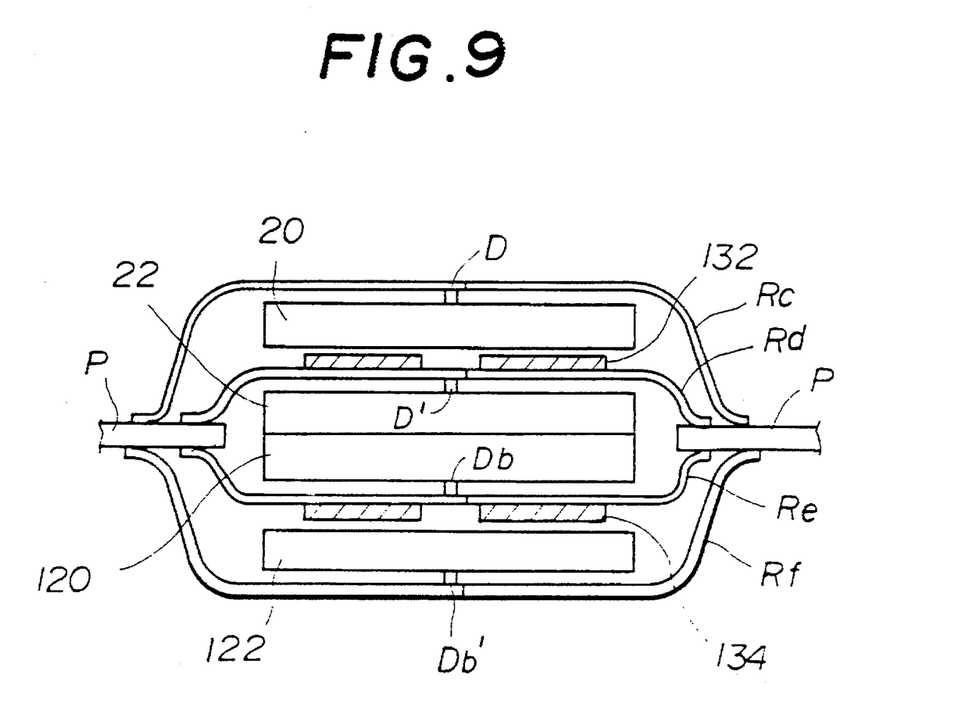
FIG. 9 is a cross-sectional view of a semiconductor device according to a fifth embodiment of the present invention.

FIG. 9 shows a semiconductor device according to a fifth embodiment of the present invention. In FIG. 9, parts that are the same as parts shown in the previously described figures are given the same reference numbers. The back surfaces of the chips 22 and 120 are joined to each other. TAB leads Rd have first ends connected to the pins P, and second ends connected to the bumps D' formed on the main surface of the chip 22. TAB leads Re have first ends connected to the pins, and second ends connected to the bumps Db formed on the main surface of the chip 120.

The chip 20 is located above the chip 22 and is supported by TAB leads Rc, which have first ends connected to the pins P, and second ends connected to the bumps D formed on the main surface of the chip 20. The chip 122 is located below the chip 120 and is supported by TAB leads Rf, which have first ends connected to the pins P, and second ends connected to the bumps Db' formed on the main surface of the chip 122. Insulating TAB tapes 132 attached to the TAB leads Rd are opposite to the back surface of the chip 20, and insulating TAB tapes 134 attached to the TAB leads Re are opposite to the back surface of the chip 122.

According to the fifth embodiment of the present invention, the four chips 20, 22, 120 and 122 are supported by and connected to the TAB leads. In the aforementioned fourth embodiment shown in FIGS. 8A and 8B, the two chips 22 and 120 are supported to and connected to the pins P, and the remaining two chips 20 and 122 are supported to and connected to the TAB leads Ra and Rb. It is possible to provide insulating films on the main surfaces of the chips 20, 22, 120 and 122. The assembly shown in FIG. 9 is sealed as in the case of the semiconductor device shown in FIG. 8B. The gaps and spaces in the assembly are filled with resin.

Figure 10A:
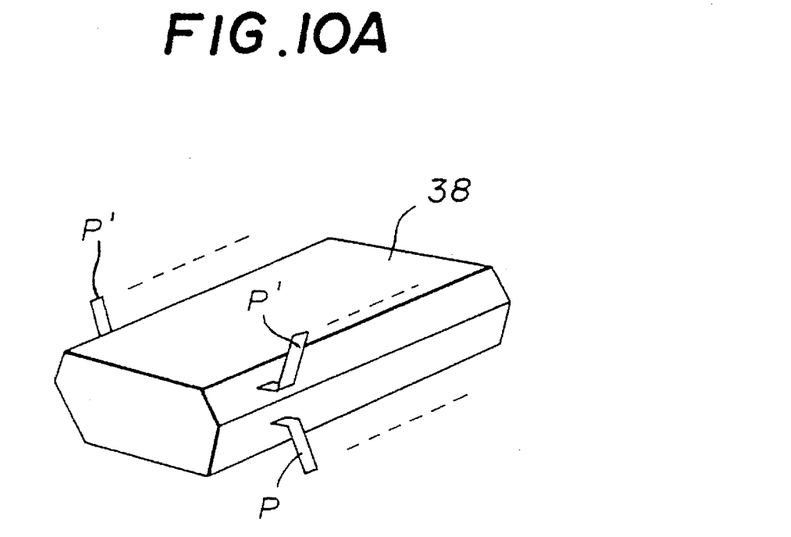
FIG. 10A is a perspective view of a semiconductor device according to a sixth embodiment of the present invention.
Figure 10B:
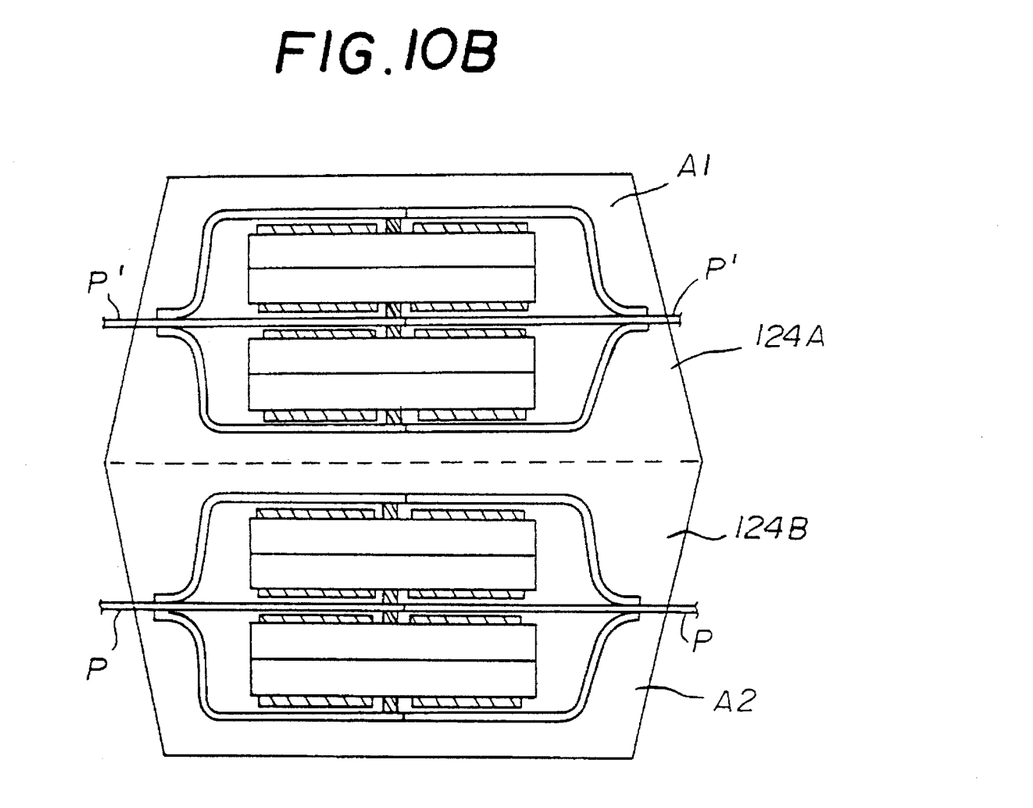
FIG. 10B is a cross-sectional view of the semiconductor device according to the sixth embodiment of the present invention.

FIGS. 10A and 10B illustrate a semiconductor device according to a sixth embodiment of the present invention. As shown in FIG. 10B, the semiconductor device according to the sixth embodiment comprises two assemblies A1 and A2, each of which has the same structure as shown in FIG. 8B. The assembly A1 having pins P' is sealed in a package 124A of resin formed so that it has a trapezoidal cross section. Similarly, the assembly A2 having pins P is sealed in a package 124B of resin formed so that it has the almost the same trapezoidal cross section as the package 124A. The package 124A and the package 124B are fastened to each other by, for example, an adhesive. Alternatively, the assemblies A1 and A2 can be sealed at a time. As shown in FIG. 10A, the pins P' are curved upwards, and the pins P are curved downwards.

It can be seen from the above that a large number of combinations of the embodiments can be made.

Figure 11A:
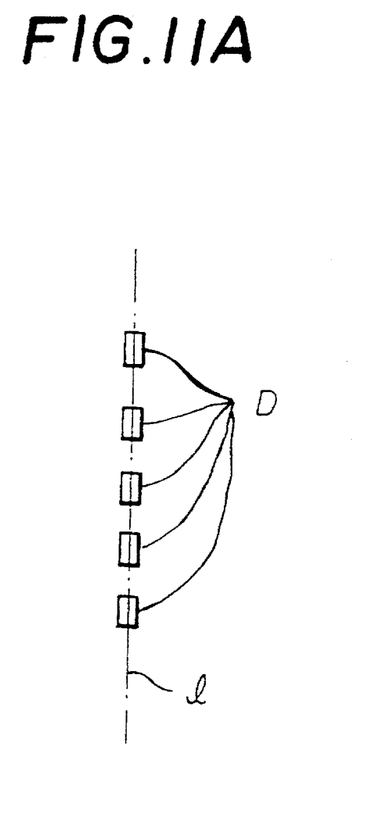
FIG. 11A is a diagram showing an arrangement of bumps used in the embodiments of the present invention.
Figure 11B:
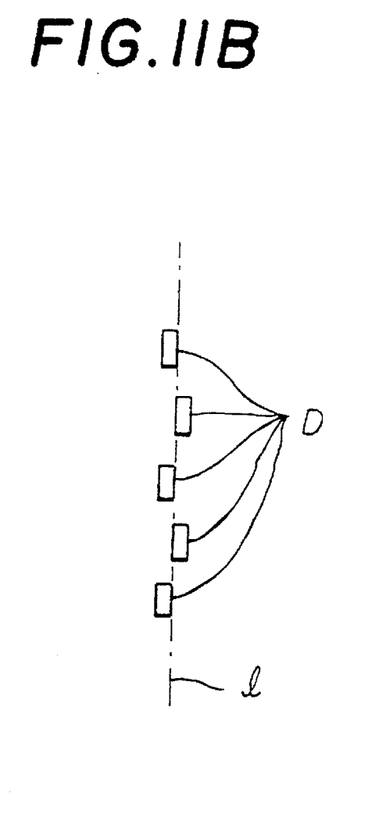
FIG. 11B is a diagram showing an alternative arrangement of bumps used in the embodiments of the present invention.

In the above description, the bumps D are arranged in a line 1, as shown in FIG. 11A. However, it is possible to arrange the bumps D so that the bumps D slightly deviate from the line 1, as shown in FIG. 11B. If the bumps D greatly deviate from the line 1, the condition of the connections between the bumps and the pins of one chip will be greatly different from that of the connections between the bumps and the pins of an other chip. In this case, the resistances, inductances or capacitances of the TAB leads of two or more chips will be different from each other.

The present invention can be applied to various integrated circuits. The most typical example is a memory device, such as a DRAM or SRAM device. In some applications, the chip select terminals can be omitted.

It is possible to use bonding wires in lieu of the TAB leads. It is also possible for the pins or leads to have curved portions, as disclosed in the aforementioned international publication.

The present invention is not limited to the specifically disclosed embodiments, and variations and modifications may be made without departing from the scope of the present invention.

What is claimed is:

1. A semiconductor device, comprising:

a first chip having a circuit arrangement, and a plurality of first terminals formed on a center position of a main surface of the first chip along one of a short side and a long side of the first chip and substantially arranged into a line;

a second chip having a circuit arrangement identical to that of the first chip, and a plurality of second terminals formed on a center portion of a main surface of the second chip along one of a short side and a long side of the second chip and substantially arranged into a line, the first and second chips being arranged in a stacked formation so that the main surfaces of the first and second chips face each other or are arranged back to back;

a plurality of connecting members connected to the first terminals and the second terminals and provided for external connections;

a resin package sealing the first and second chips and the plurality of connecting members; and external connection members having first surfaces and second surfaces opposite to the first surfaces,
   the connecting members connected to the first terminals being connected to the first surfaces of the external connection members, and
   the connecting members connected to the second terminals being connected to the second surfaces of the external connection members,
   wherein an arrangement of the connecting members of the first one of the chips over the circuit arrangement thereof is different from that of the connecting members of the second one of the chips over the circuit arrangement thereof.

2. The semiconductor device as claimed in claim 1, wherein:

each of the first and second chips has a rectangular shape;

the first terminals are arranged in a line in a longitudinal direction of the first chip; and the second terminals are arranged in a line in a longitudinal direction of the second chip.

3. The semiconductor device as claimed in claim 1, wherein:

each of the first and second chips has a rectangular shape;

the first terminals are arranged in a line in a direction perpendicular to a longitudinal direction of the first chip; and the second terminals are arranged in a line in a direction perpendicular to a longitudinal direction of the second chip.

4. The semiconductor device as claimed in claim 1, wherein:

the first chip has a back surface opposite to the main surface thereof;

the second chip has a back surface opposite to the main surface thereof; and the back surface of the first chip is in contact with the back surface of the second chip.

5. The semiconductor device as claimed in claim 1, wherein the first chip and second chip are arranged in the predetermined direction so that the main surface of the first chip is opposite to the main surface of the second chip.

6. The semiconductor device as claimed in claim 1, wherein said connecting members comprise:

a plurality of lead members for external connections; and tape-automated bonding leads connecting the first and second terminals to the lead members.

7. The semiconductor device as claimed in claim 1, further comprising:

a first insulating member provided between the main surface of the first chip and the connecting members connected to the first terminals formed on the main surface of the first chip; and a second insulating member provided between the main surface of the second chip and the connecting members connected to the second terminals formed on the main surface of the second chip.

8. The semiconductor device as claimed in claim 7, wherein:

the first insulating member is in contact with the main surface of the first chip; and the second insulating member is in contact with the main surface of the second chip.

9. The semiconductor device as claimed in claim 7, wherein:

the first insulating member is in contact with the connecting members connected to the first terminals formed on the main surface of the first chip; and the second insulating member is in contact with the connecting members connected to the second terminals formed on the main surface of the second chip.

10. The semiconductor device as claimed in claim 7, wherein:

the first insulating member is in contact with both the main surface of the first chip and the connecting members connected to the first terminals formed on the main surface of the first chip; and the second insulating member is in contact with both the main surface of the second chip and the connecting members connected to the second terminals formed on the main surface of the second chip.

11. The semiconductor device as claimed in claim 5, wherein the first chip and the second chip are spaced apart from each other in the predetermined direction.

12. The semiconductor device as claimed in claim 1, wherein:

said connecting members comprise a plurality of lead members for external connections; and the lead members are directly connected to the first and second terminals.

13. The semiconductor device as claimed in claim 12, wherein:

the first chip and second chip are arranged in the predetermined direction so that the main surface of the first chip is opposite to the main surface of the second chip; and the lead members extend in a straight manner between the first and second chips and in parallel with the main surfaces of the first and second chips.

14. The semiconductor device as claimed in claim 1, wherein the connecting members comprise:

a plurality of lead members for external connections; and tape-automated bonding leads connecting the first and second terminals to the lead members, and wherein;

the first chip has a back surface opposite to the main surface thereof;

the second chip has a back surface opposite to the main surface thereof; and the back surface of the first chip is in contact with the back surface of the second chip.

15. The semiconductor device as claimed in claim 14, wherein the tape-automated bonding leads comprise curved portions.

16. The semiconductor device as claimed in claim 14, further comprising:

a first insulating film provided between the main surface of the first chip and the tape-automated bonding leads connected to the first terminals formed on the main surface of the first chip; and a second insulating film provided between the main surface of the second chip and the tape-automated bonding leads connected to the second terminals formed on the main surface of the second chip.

17. The semiconductor device as claimed in claim 1, wherein the connecting members comprise:

a plurality of lead members for external connections; and tape-automated bonding leads connecting the first and second terminals to the lead members, and wherein;

the first chip and second chip are arranged in the predetermined direction so that the main surface of the first chip is opposite to the main surface of the second chip.

18. The semiconductor device as claimed in claim 17, wherein the tape-automated bonding leads extend in a straight manner and in parallel with the main surfaces of the first and second chips.

19. The semiconductor device as claimed in claim 17, wherein the tape-automated bonding leads are spaced apart from each other.

20. The semiconductor device as claimed in claim 1, wherein the first chip and the second chip are vertically stacked so that the first chip and the second chip are spaced apart from each other in the predetermined direction.

21. The semiconductor device as claimed in claim 2, wherein:

the first terminals are located at a center portion on the main surface of the first chip extending in the longitudinal direction of the first chip; and the second terminals are located at a center portion on the main surface of the second chip extending in the longitudinal direction of the second chip.

22. The semiconductor device as claimed in claim 3, wherein:

the first terminals are located at a center portion on the main surface of the first chip extending in the direction perpendicular to the longitudinal direction of the first chip; and the second terminals are located at a center portion on the main surface of the second chip extending in the direction perpendicular to the longitudinal direction of the second chip.

23. The semiconductor device as claimed in claim 1, further comprising a package in which the first and second chips are sealed.

24. A semiconductor device, comprising:
a plurality of chips respectively having main surfaces and identical circuit arrangements, the chips being arranged in a stacked formation so that the main surfaces of the chips face each other or are arranged back to back, each of the chips having a plurality of terminals formed on a center portion of the main surface along one of a short side and a long side of each of the chips and substantially arranged in a line;
a plurality of connecting members connected to the terminals of the chips and provided for external connections,
  a first one of the chips having a back surface opposite to the main surface thereof,
  a second one of the chips having a back surface opposite to the main surface thereof, and
  the back surface of said first one of the chips being in contact with the back surface of said second one of the chips;
a resin package sealing the first one and the second one of the chips and the plurality of connecting members; and
external connection members having first surfaces and second surfaces opposite to the first surfaces,
  the connecting members connected to the terminals being connected to the first surfaces of the external connection members, and
  the connecting members connected to the terminals being connected to the second surfaces of the external connection members,
wherein an arrangement of the connecting members of the first one of the chips over the circuit arrangement thereof is different from that of the connecting members of the second one of the chips over the circuit arrangement thereof.

25. The semiconductor device as claimed in claim 24, wherein:
a third one of the chips has a back surface opposite to the main surface thereof;
a fourth one of the chips has a back surface to the main surface thereof;
the back surface of said third one of the chips is in contact with the back surface of said fourth one of the chips;
the first, second, third and fourth ones of the chips are arranged in this order in the predetermined direction; and
the main surface of the second one of the chips is opposite to the main surface of the third one of the chips.

26. The semiconductor device as claimed in claim 24, wherein:
the connecting members comprise lead members for external connections, and tape-automated bonding leads provided for the first and fourth ones of the chips;
the lead members have ends connected to the terminals formed on the main surfaces of the second and third ones of the chips; and
tape-automated bonding leads have first ends connected to the terminals formed on the main surfaces of the first and fourth ones of the chips, and second ends connected to the lead members.

27. The semiconductor device as claimed in claim 26, further comprising:

a first insulating film provided between the main surface of said first one of the chips and the tape-automated bonding leads connected to the terminals formed on the main surface of said first one of the chips;
a second insulating film provided between the main surface of said second one of the chips and the lead members connected to the terminals formed on the main surface of said second one of the chips;
a third insulating film provided between the main surface of said third one of the chips and the lead members connected to the terminals formed on the main surface of said third one of the chips; and
a fourth insulating film provided between the main surface of said fourth tone of the chips and the tape-automated bonding leads connected to the terminals formed on the main surface of said fourth one of the chips.

28. The semiconductor device as claimed in claim 27, wherein:
the first insulating film is in contact with the main surface of said first one of the chips;
the second insulating film is in contact with the main surface of said second one of the chips;
the third insulating film is in contact with the main surface of said third one of the chips; and
the fourth insulating film is in contact with the main surface of said fourth one of the chips.

29. The semiconductor device as claimed in claim 24, wherein:
a third one of the chips has a back surface opposite to the main surface thereof;
a fourth one of the chips has a back surface to the main surface thereof;
the first, second, third and fourth ones of the chips are arranged in this order in the predetermined direction;
the main surface of the second one of the chips is opposite to the main surface of the third one of the chips;
the back surface of said first one of the chips is opposite to the main surface of said second one of the chips; and
the back surface of said fourth one of the chips is opposite to the main surface of said third one of the chips.

30. The semiconductor device as claimed in claim 29, wherein:
the connecting members comprise first, second, third and fourth tape-automated bonding leads, and lead members;
the first tape-automated bonding leads connect the lead frames to the terminals formed on the main surface of said first one of the chips;
the second tape-automated bonding leads connect the lead frames to the terminals formed on the main surface of said second one of the chips;
the third tape-automated bonding leads connect the lead frames to the terminals formed on the main surface of said third one of the chips; and
the fourth tape-automated bonding leads connect the lead frames to the terminals formed on the main surface of said fourth one of the chips.

31. The semiconductor device as claimed in claim 24, further comprising a package in which the chips are sealed.

32. A semiconductor device, comprising:
a plurality of chips respectively having main surfaces and identical circuit arrangements, the chips being arranged in a stacked formation so that the main surfaces of the chips face each other or are arranged back to back, each of the chips having a plurality of terminals formed on a center portion of the main surface along one of a short side and a long side of each of the chips, and substantially arranged in a line;

a plurality of connecting members connected to the terminals of the chips and provided for external connections, the chips being grouped into a plurality of groups, each of the groups including a first one of the chips having a back surface opposite to the main surface thereof, and a second one of the chips having a back surface opposite to the main surface thereof, and the back surface of said first one of the chips being in contact with the back surface of said second one of the chips;

a resin package sealing the first one and the second one of the chips and the plurality of connecting members; and external connection members having first surfaces and second surfaces opposite to the first surfaces, the connecting members connected to the terminals being connected to the first surfaces of the external connection members, and the connecting members connected to the terminals being connected to the second surfaces of the external connection members, wherein an arrangement of the connecting members of the first one of the chips over the circuit arrangement thereof is different from that of the connecting members of the second one of the chips over the circuit arrangement thereof.

33. The semiconductor device as claimed in claim 1, wherein:

the plurality of connecting members has inner portions provided in the resin package and outer portions extending from the resin package;

the outer portions are provided in common to the first and second terminals; and the inner portions connecting the first terminals and the second terminals to the outer portions.

34. The semiconductor device as claimed in claim 24, wherein:

the plurality of connecting members has inner portions provided in the resin package and outer portions extending from the resin package;

the outer portions are provided in common to the first and second terminals; and the inner portions connecting the first terminals and the second terminals to the outer portions.

35. The semiconductor device as claimed in claim 32, wherein:

the plurality of connecting members has inner portions provided in the resin package and outer portions extending from the resin package;

the outer portions are provided in common to the first and second terminals; and the inner portions connecting the first terminals and the second terminals to the outer portions.

* * * * *